United States Patent [19]

Anderson et al.

[11] Patent Number: 4,493,075
[45] Date of Patent: Jan. 8, 1985

[54] SELF REPAIRING BULK MEMORY

[75] Inventors: James M. Anderson, Campbell; Thomas S. Knight, III, Sunnyvale; Dennis T. Kitagawa; Ernesto Rey, both of San Jose, all of Calif.

[73] Assignee: National Semiconductor Corporation, Santa Clara, Calif.

[21] Appl. No.: 379,202

[22] Filed: May 17, 1982

[51] Int. Cl.³ .................. G11C 29/00; G06F 11/20
[52] U.S. Cl. ............................... 371/10; 365/200
[58] Field of Search ........................ 371/10; 365/200

[56] References Cited

U.S. PATENT DOCUMENTS

| | | | |
|---|---|---|---|
| 3,434,116 | 3/1969 | Anacker | 371/10 X |
| 3,633,175 | 5/1969 | Harper | 371/10 X |
| 3,772,652 | 11/1973 | Hilberg | 371/10 X |
| 4,051,354 | 9/1977 | Chaote | 371/10 |
| 4,321,695 | 3/1982 | Redwine et al. | 365/200 X |
| 4,342,084 | 7/1982 | Sager et al. | 364/200 |
| 4,376,300 | 3/1983 | Tsang | 365/200 |
| 4,389,715 | 6/1983 | Eaton, Jr. et al. | 365/200 |
| 4,422,161 | 12/1983 | Kressel et al. | 365/200 |

Primary Examiner—Charles E. Atkinson
Attorney, Agent, or Firm—Gail W. Woodward; Paul J. Winters; Michael J. Pollock

[57] ABSTRACT

A large scale memory system that can use devices with some defective memory cells in them since bad cells and bad devices are recorded in a separate permanent memory that accompanies the system. The permanent memory is continuously referred to so as to avoid defective cells during accessing. Spare devices are automatically incorporated in the system, as needed, to facilitate self repairing.

16 Claims, 2 Drawing Figures

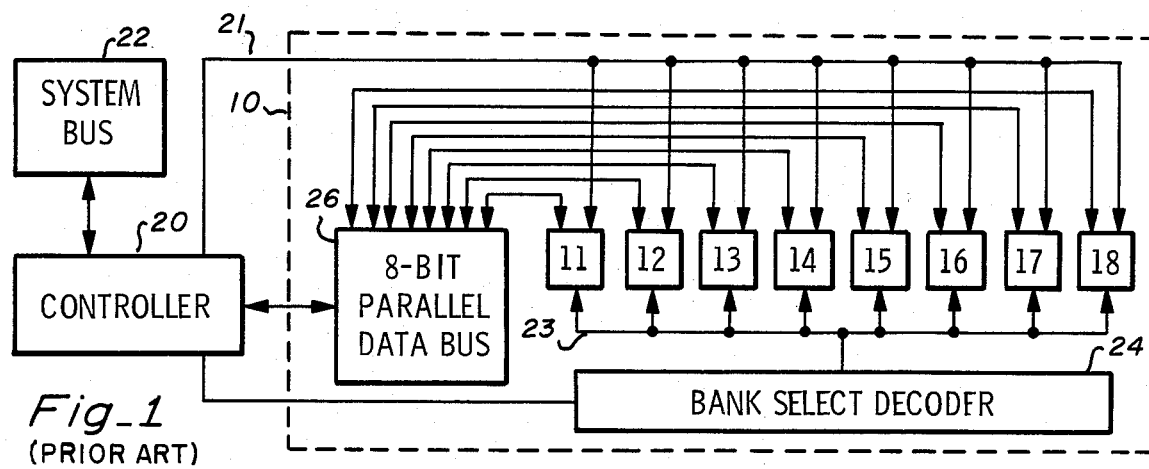
Fig_1 (PRIOR ART)
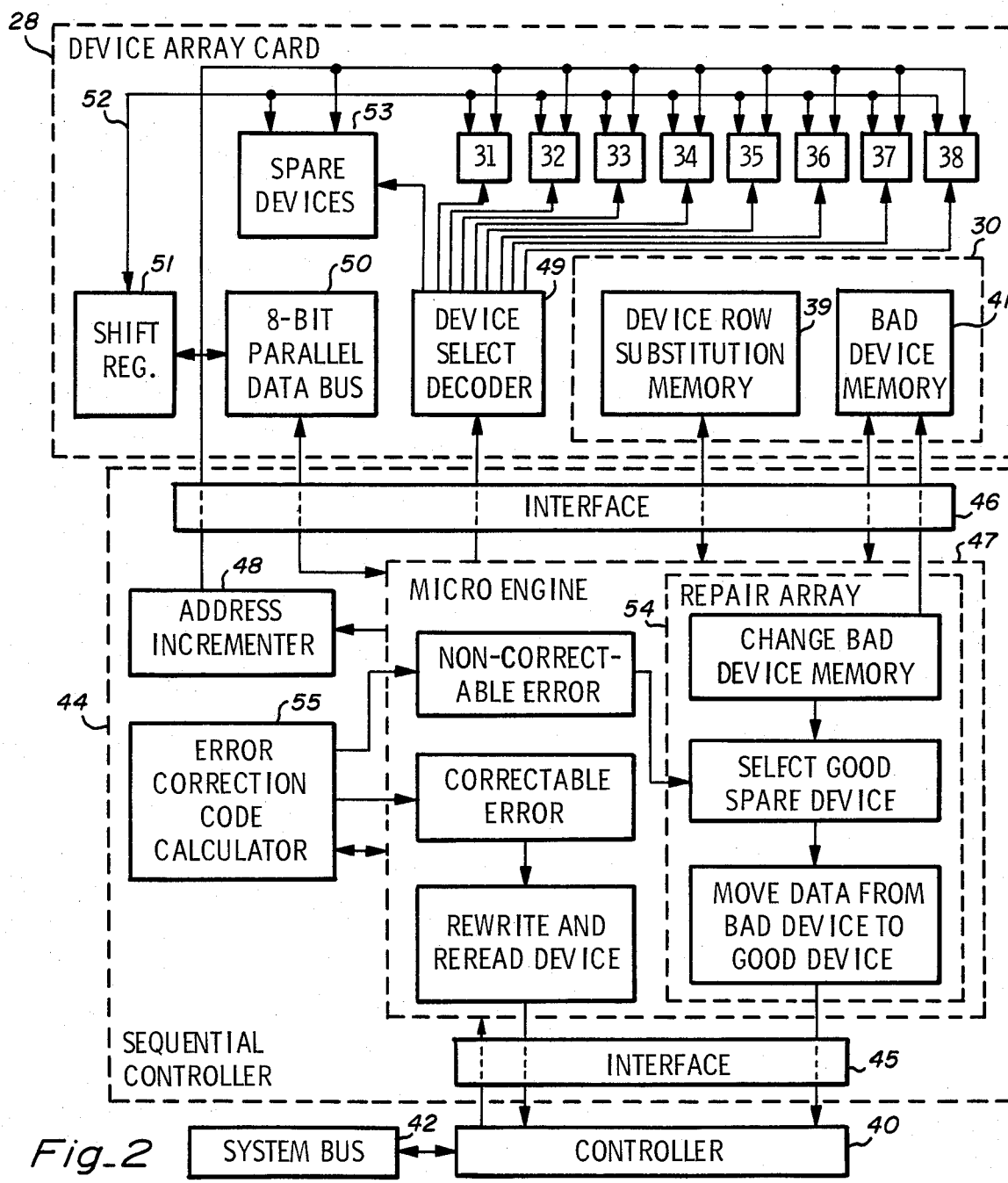
Fig_2

SELF REPAIRING BULK MEMORY

BACKGROUND OF THE INVENTION

Solid state bulk memory is constructed by assembly arrays of semiconductor devices connected in parallel to common address leads, common input/output leads, and other common circuitry. Typically, one finds several hundred devices mounted on one plug-in card. If the devices have, say, sixteen thousand memory cells each, the card has about a half a megabit capacity.

In the prior art, data is stored and retrieved one word at a time. Typical prior art word lengths range from eight to sixty-four bits. For ease of description an eight bit word size is used for comparison herein. If a word length of eight bits is being used, the writing of data involves choosing a row and column address, presenting that address over the common circuitry to all of the devices, and enabling a certain group of eight devices on the card so that one bit of the word is stored in each device. If even one bit is incorrectly stored, problems arise when the word is later read out for use by the system. Accordingly, it has always been an objective of the prior art to have absolutely perfect memory devices in which every one of the thousands of memory cells on each device works reliably within a standardized set of parameters. This means that extensive testing must be performed on memory devices before they can be sold to users. The testing is expensive. And despite very high quality controls used in the manufacturing process, significant fractions of the devices do not pass the tests and must be rejected, thus lowering yields and increasing costs even more.

So far, the only way known to partially avoid this problem is to resurrect a few of the rejected devices in which only one or two bad memory cells exist in a known part of the device. If the bad cells are in just one area of the device, the bad area can be identified and the devices sold as "half good", "three-quarter good", or "one-quarter good" devices. These parts are then used as good parts of smaller size, the bad areas being avoided totally.

It would be very beneficial if a way could be found to utilize memory devices that were less than perfect, since the consistent production of perfect devices is unlikely to ever be attainable. To do this effectively, however, a wider range of partially defective memory devices should be usable, not just those that can be classified as "half good" or "quarter good." It is also desirable to be able to correct for additional bad memory cells that develop in the future. The present invention achieves these ends.

SUMMARY OF THE INVENTION

Briefly, this invention contemplates the provision of a non-volatile memory, in association with each array of devices, that stores information on the exact bad rows in each device in the array. A special controller can then interrogate the non-volatile memory, as data is read or written, to identify and avoid bad rows in the devices. In this way, the array may use substandard devices in which some rows contain bad or substandard memory cells. These rows are, of course, randomly distributed from device to device. Hence, if one addresses or enables eight devices at a time, the probability that at least one of these devices has a bad row in line with the addressed row is objectionably high. Thus, to increase efficiency, decrease the chances of hitting a bad row, and lessen the size of the non-volatile memory that must remember all the bad rows, this invention contemplates writing and reading devices in smaller numbers at a time, such as four at a time, two at a time, or one at a time, the latter being most efficient in the preferred embodiment. Since the data enters and leaves the array in a more serial fashion than normal, a shift register is used with each array to transform data from serial to parallel form during read out and from parallel to serial form during writing. In this way the memory system has the appearance of a conventional parallel bus access memory to any external system connected thereto.

The choice of whether to enable one, two, four or more devices at a time turns out to be dictated by economic concerns that have to do with the scale of the system, the quality of the devices, the size of the non-volatile memory and other matters not related to the inventive concept. Accordingly, the invention is described herein as enabling one device at a time where the device could be, for example, a 64K or 256K RAM. However, two devices at a time works well also under some other design tradeoffs. So the word "device" should be understood to also include, for the purposes of this specification and claims, groups of two devices or even groups of four devices.

Since the invention incorporates a permanent memory with each array of devices that remembers which rows are bad, it becomes possible to use a part of that permanent memory to remember which devices are totally unusable. Totally unusable devices are defined as those devices that have an excessive number of rows that are bad. The exact number of rows used to meet this criteria, again, may vary. But there is an optimum point at which it is preferable to switch to a spare device rather than try to remember all the bad rows in an original device. This invention therefore also incorporates a number of spare devices in each array along with a suitably programmed controller that can detect faulty read out data and switch over to a spare device. The bulk memory system of this invention is thus self repairing which further enhances its ability to utilize substandard devices.

The use of substandard devices, which were previously thrown away, is obviously very inexpensive. But additional advantages accrue as well. The system can not fail as such, but simply gradually uses up its supply of spare devices. It may therefore be programmed to keep track of and signal a lowering supply of spare devices which means that maintenance can be effected at a relaxed and convenient pace, as time and other service calls permit. Since the prior art systems had to be perfect, devices were socket mounted for fast and easy replacement in the event of failure. This invention repairs itself, so the expensive sockets can be eliminated and the devices soldered into the array. Soldering provides a better electrical connection and fewer transient errors.

In general, a bulk memory system constructed according to the principles of this invention is considerably cheaper than standard solid-state systems, although a little slower, and much faster than disk memory systems, although a little more expensive. Hence, the designer is provided a useful bulk memory alternative that fills the gap between fast expensive solid-state memories and cheap but slow disk memories. Numerous other advantages will become apparent upon consideration of the following detailed description.

BRIEF DESCRIPTION OF THE DRAWING

FIG. 1 shows the typical prior art arrangement for working a bank of devices at one time in an array.

FIG. 2 schematically shows how this invention selects a device at a time for access in cooperation with an array located memory that stores information on the characteristics of the selected device.

DESCRIPTION OF THE PREFERRED EMBODIMENT

The prior art system is shown in FIG. 1 where a typical device array card is schematically portrayed by dashed line 10. For simplicity, only eight memory devices 11-18 are described although typically several hundred devices would be found on each card 10. Each device may comprise, for example, a 64000 cell or 256000 cell random access memory device of a type well known to those in the art.

To access information in the memory, a controller 20 cooperates with a system bus 22 to deliver address information to a bank select decoder 24. Decoder 24 enables the correct group of eight devices simultaneously and an entire word is presented at one time on an 8-bit parallel data transfer bus 26. All devices on card 10 receive the row and column address information from controller 20, by way of common address lines 21, but only the correct eight devices 11-18 are enabled by a common enable circuit 23. If all eight devices work perfectly, that is, the same memory cell at the same row and column address in each device works correctly, the correct 8-bit word is presented to bus 26. This invention, however, need not have every single memory cell in each device working correctly as can be seen by reference to FIG. 2.

In FIG. 2, again, a device array card is shown, this time with a dashed line 28, containing eight devices 31-38. Devices 31-38 may each have some bad cells. In the preferred embodiment, wherever a bad cell exists, the entire row containing that cell is regarded as bad and therefore that row in the one device is not used. The bad rows in each device are identified and remembered by a non-volatile memory 30 which may comprise, for example, an EPROM or electrically programmable read only memory. EPROM 30 has a portion usable as a device row substitution memory 39 and a portion usable as a bad device memory 41. EPROM 30 is physically located on card 28 so as to permanently store information on the unique bad row and bad device inventory of the particular card 28. For this embodiment, we have chosen to define a bad device as any device in which more than four rows are bad. Alternatively, columns rather than rows could be considered bad if the column contained a bad cell. In this sense, the word "row" in this specification can be taken to include columns as well.

As before, a controller 40 cooperates with a system bus 42 to deliver address information to card 28. But in the invention, an intermediate sequential controller 44 is employed to make the necessary translation of address instructions needed to avoid unusable devices and bad rows in usable devices. Sequential controller 44 receives and transmits information through conventional interface buffer circuitry 45 and 46. A micro engine 47, constructed specifically for this task in a manner well known to those skilled in the art, receives address information from controller 40 and presents that address information to an address incrementer 48 and a device select decoder 49. Micro engine 47 also receives data to be stored in the memory system and presents that data to a parallel data transfer bus 50. Instead of storing an 8-bit word at the same address in 8 different devices, as in the prior art, the 8-bit word is stored in just one device selected by decoder 49. This 8-bit word is converted by a shift register 51 into eight consecutive serial bits and presented on a data transfer line 52 to all the devices. Decoder 49 enables only one of the devices, such as device 31. Incrementer 48 changes the address by one unit as each data bit is presented on line 52 to device 31. In the preferred embodiment, incrementer 48 changes the column selection one unit at a time, while holding a particular row, since this is a somewhat faster way to write into a typical dynamic RAM device than by incrementing rows. However, one could, if desired, increment by rows while holding a particular column. In this case, faulty columns would be avoided and EPROM 30 would operate as a device column substitution memory 39. Hence, the 8-bit word is stored in eight memory cells in one row of one device. The reverse procedure permits the word to be read out of memory. Device 31 is enabled, incrementer 48 converts the starting address to eight consecutive addresses, advancing by columns, and the serial data on input/output line 52 is assembled by shift register 51 and presented to parallel bus 50 for transfer by sequential controller 44 to controller 40.

Device 31, by the criteria we use, may have up to four bad rows among a total of 256 rows. Thus, the chances of an address hitting a bad row are less than 2%. If all eight devices 31-38 were addressed at the same time, with the same row address, the chances of hitting a bad row could approach 12% which is much too high. Accordingly, we describe a system in which only one device is enabled at a time. However, there are speed advantages to choosing, for example, two devices, such as 31 and 32, at a time. The chances of hitting a bad row would still be under 4% and in some architectures this would be acceptable. Even four devices at a time may work. A similar efficiency could be encountered if one used only one device at a time, but accepted up to eight bad rows. Whatever tradeoffs prove most efficient, the main idea is to not overwhelm the capacity of EPROM 30 to store information on bad rows and devices. Thus, the phrase "enable one device at a time" should be construed to mean choosing some segment of the array card 28 that is compatible with the capacity of memory 39.

Microengine 47 interrogates memory 39 upon the processing of each group of addresses. During manufacturing, memory 39 is programmed to store the replacement row address for each bad row address as determined during a test procedure designed to characterize each card 28. If a bad row address is presented by controller 40, microengine 47 detects that by comparison with memory 39 and supplies the replacement address to controller 40. Four replacement rows are reserved in each device for use in the event of bad rows in the device. The total bit capacity of card 28 is thereby reduced a little and extra devices may be supplied to make that up. But card 28 carries several spare devices 53 for use when other devices fail and repairs are needed.

Microengine 47 has an ability to repair the array which stems from a set of stored array repair instructions 54 and an error correction code (ECC) calculator 55. In a well known manner, data stored in the array 28 is accompanied by a code number developed from ECC calculator 55. When data is read out of memory, the same calculation is done by ECC calculator 55 and the developed code number compared to the stored code number. A mismatch indicates an error. Microengine 47 can determine, using prior art techniques, if the mistake is correctable. If so, controller 40 is caused to rewrite and reread the data. If the data reads out wrong again, or if the first error was not correctable, microengine 47 is programmed to follow the instruction set 54 to accomplish a repair. Microengine 47 selects a spare device from among devices 53 on card 28 and writes the data into the selected spare device.

In addition, microengine 47 updates bad device memory 41 to store information on the newly detected bad device. Microengine 47 interrogates memory 41 whenever decoder 49 is supposed to select a device and causes controller 40 to choose a certain spare device whenever a certain bad device is addressed. The system may also be programmed to signal to the user when the supply of spare devices 53 is becoming low.

What is claimed is:

1. A bulk memory system comprising in combination:
   at least one array of storage devices, each of said devices having a multiplicity of memory cells arranged in a pattern of rows and columns;
   data transfer means connected to all of the devices in the array;
   row and column address supplying means connected to all of the devices in the array;
   device selecting means operable to select and enable one device at a time, so as to connect said one device to the data transfer means, for the purpose of communicating with the memory cell addressed by said row and column address supplying means in the one device;
   sequencing means connected to said address supplying means, operable to increment the address sequentially through successive memory cells so as to connect the successive cells to the data transfer means;
   serial to parallel data conversion means connected to said transfer means so as to permit conversion of the serial bits from said successive memory cells into parallel words; and
   sequential controlling means connected to said address supplying means, said selecting means, said sequencing means, and said conversion means, responsive to external system requests for memory data to coordinate the enabling of devices and incrementing of addresses in such a way as to present parallel words to the external system.

2. The memory system of claim 1 in which said data transfer means comprises input and output means and said conversion means also permits conversion of parallel words from the external system into serial bits for said successive memory cells.

3. The memory system of claim 1 including nonvolatile memory means connected to said sequential controlling means, physicaly associated with said array of storage devices, and operable to store address information relative to the useful portions of the array of storage devices.

4. The memory system of claim 1 including spare storage devices among said array of storage devices.

5. The memory system of claim 4 including memory means, connected to said sequential controlling means, physically associated with said array of devices, and operable to store address information on which of the devices are not usable and also on which rows in the devices that are usable are not usable, said information being obtained from said sequential controlling means during a characterizing initial test procedure.

6. The memory system of claim 4 including in association with said array, an error code writing and reading system connected to said data transfer means and operable to write a calculated error code into said array in conjunction with the data and distinguish between correctable and non-correctable errors in the reading of the data.

7. The memory system of claim 6 including memory means connected to said sequential controlling means, physically associated with said array having a first portion to store address information on which of the devices are not usable and further including repairing means connected to said array and operable, in response to the detection of a non-correctable error by said error code system, to select a spare device in said array, transfer all the data out of the device that produced the data with the non-correctable error into said spare device and change said memory means so as to update the information on which devices are not usable to include the device that yielded the non-correctable error.

8. The memory system of claim 1 including memory means physically located with said array and connected to said sequential controlling means having a second portion operable to store address information on which rows in the devices are not usable and further including programmed substituting means connected to said array operable to address spare rows in the devices in substitution for rows that are not usable.

9. The memory system of claim 1 in which said memory devices comprise at least some devices in which some of the rows include substandard cells being randomly located from device to device.

10. The memory system of claim 9 in which said transfer means functions as an input and output means and including parallel to serial data conversion means to convert parallel data from said external system to serial data for said input means.

11. The memory system of claim 10 including a nonvolatile memory means physically located on said array of storage devices and connected to said sequential controlling means.

12. The memory system of claim 11 in which said memory means has a second portion that stores information on which rows in each device include substandard memory cells, and including substitution means programmed and operable to address spare rows in each device in substitution for substandard rows, in response to requests for information from said external system directed to said substandard rows.

13. The memory system of claim 12 also including spare storage devices located with said array of storage devices.

14. The memory system of claim 13 including an error correction code production and detection system connected to said array and operable in response to data read out of said parallel words to detect correctable and not-correctable errors in the read out data.

15. The memory system of claim 14 in which said memory means has a first portion that stores information on which devices in the array have too many substandard memory cell containing rows to be usable.

16. The memory system of claim 15 including repairing means connected to said array and to said error code production and detection system and responsive to the detection of a non-correctable error by said detection system, to transfer data from the device responsible for the non-correctable error to one of said spare devices, and further to change said first portion of the memory means to include said responsible device in its stored information.

* * * * *